United States Patent
Fraisse et al.

(10) Patent No.: US 9,204,215 B2
(45) Date of Patent: Dec. 1, 2015

(54) ONE-BIT DIGITAL-TO-ANALOG CONVERTER OFFSET CANCELLATION

(71) Applicant: ST-Ericsson SA, Plan-les-Ouates (CH)

(72) Inventors: Christian Fraisse, Grenoble (FR); Angelo Nagari, Grenoble (FR)

(73) Assignee: ST-ERICSSON SA, Plan-les-Ouates (CH)

(*) Notice: Subject to any disclaimer, the term of this patent is extended or adjusted under 35 U.S.C. 154(b) by 159 days.

(21) Appl. No.: 14/136,484

(22) Filed: Dec. 20, 2013

(65) Prior Publication Data
US 2014/0185835 A1    Jul. 3, 2014

Related U.S. Application Data

(60) Provisional application No. 61/752,004, filed on Jan. 14, 2013.

(30) Foreign Application Priority Data

Dec. 27, 2012   (EP) ...................................... 12306693

(51) Int. Cl.
| | |
|---|---|
| *H04B 15/00* | (2006.01) |
| *H04R 3/00* | (2006.01) |
| *H03F 3/217* | (2006.01) |
| *H03F 3/45* | (2006.01) |
| *H03M 3/00* | (2006.01) |

(52) U.S. Cl.
CPC ................ *H04R 3/00* (2013.01); *H03F 3/2175* (2013.01); *H03F 3/45968* (2013.01); *H03M 3/384* (2013.01); *H03F 2200/331* (2013.01); *H03F 2200/375* (2013.01); *H03M 3/50* (2013.01)

(58) Field of Classification Search
None
See application file for complete search history.

(56) References Cited

U.S. PATENT DOCUMENTS

| | | | | |
|---|---|---|---|---|
| 5,960,092 | A * | 9/1999 | Lai | 381/104 |
| 6,316,992 | B1 | 11/2001 | Miao et al. | |
| 8,503,695 | B2 * | 8/2013 | Chilakapati et al. | 381/94.5 |
| 2004/0227567 | A1 | 11/2004 | Llewellyn | |
| 2009/0092264 | A1 * | 4/2009 | Yamada | 381/94.5 |

OTHER PUBLICATIONS

Extended European Search Report in corresponding European Application No. 12306693.8-1805 dated Apr. 23, 2013.
Extended European Search Report issued in corresponding European application No. 12 30 6693, completion date Apr. 15, 2013.

* cited by examiner

*Primary Examiner* — Thang Tran
(74) *Attorney, Agent, or Firm* — Patent Portfolio Builders PLLC

(57) ABSTRACT

There is described Audio driver circuit comprising a main, 1-bit digital-to-analog converter, adapted to receive a 1-bit oversampled digital audio signal. Thanks to an auxiliary digital-to-analog converter which converts into the analog domain a digital offset compensation value stored in e.g. an OTP memory register 34, and to a summing and filtering arrangement, it is possible to reduce the offset cancellation granularity in order to compensate for the offset of the main digital-to-analog converter in the output signal.

15 Claims, 7 Drawing Sheets

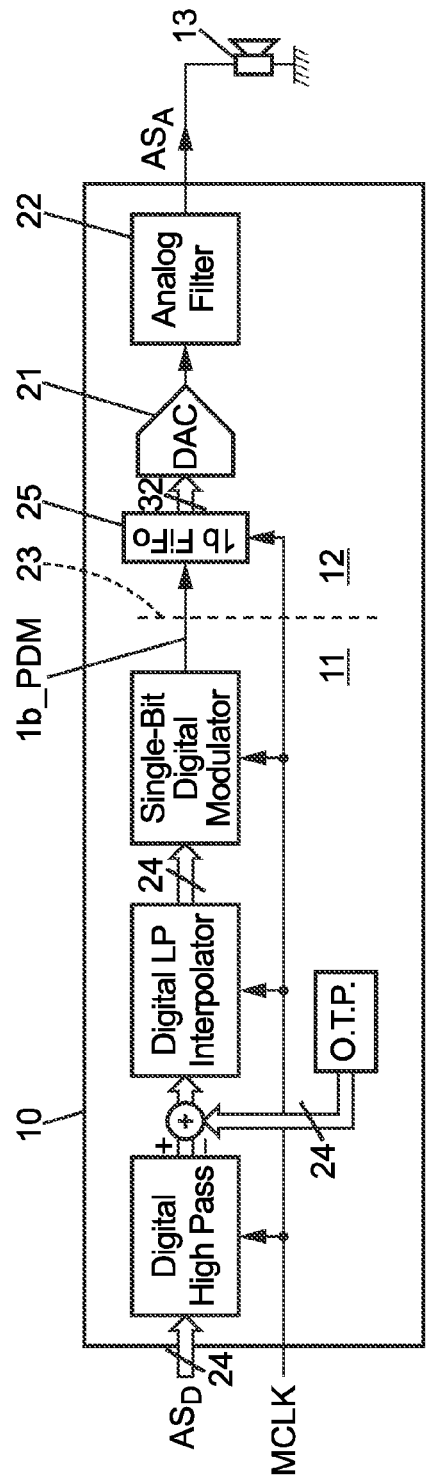
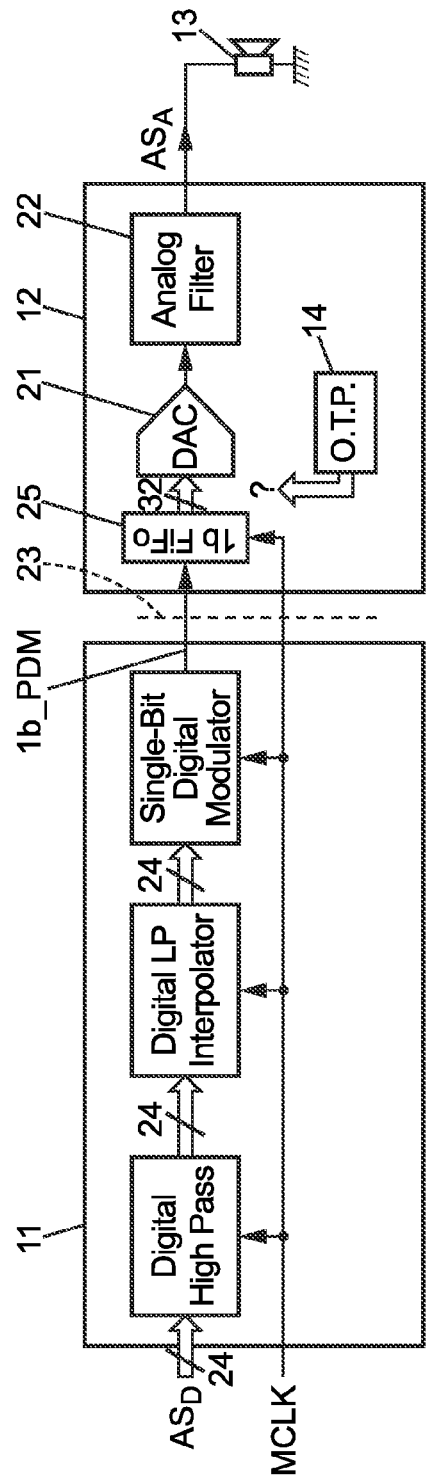
FIG. 1
FIG. 2

ONE-BIT DIGITAL-TO-ANALOG CONVERTER OFFSET CANCELLATION

RELATED APPLICATIONS

This application claims priority to U.S. Provisional Application No. 61/752,004, filed Jan. 14, 2013, which claims priority and benefit from European Application No. 12306693.8, filed Dec. 27, 2012, the entire teachings of which are incorporated herein by reference.

BACKGROUND

1. Technical Field

The present invention generally relates to 1-bit audio signal-processing technology, and more specifically to offset cancellation in an electronic device using said technology, such as for instance a 1-bit Digital-to-Analog Converter (DAC).

It finds application, for instance, in Class-D or class AB audio driver circuits with, e.g., Pulse Density Modulation (PDM) digital inputs, for wireless devices with an audio system, such as mobile phones, smart phones, digital audio players, PDAs, digital tablets, or other similar wireless products.

2. Related Art

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Audio signals are stored in digital form (for example MP3s) and, in order to be heard through speakers or a headset, they must be converted into an analog signal. DACs are therefore found in almost all modern wireless devices with an audio system.

Most current digital audio systems use multi-bit Pulse Code Modulation (PCM) to represent the audio signal in the digital domain. PCM has the advantage of being easy to manipulate. It allows signal processing operations to be performed on the audio stream, such as mixing, filtering, and equalization.

One-bit audio signal representation is another way of conveying audio digitally, in mono or stereo, over a clock/data pair. This scheme is also called Pulse Density Modulation (PDM) because the original analog waveform is converted to a density of pulses. The resulting pulses are digital, and are therefore resistant to distortion and noise which may result from signal-processing techniques applied to it.

Because it uses only one bit to convey audio, PDM is simpler in concept and execution than PCM. Recently, PDM has become very popular in the design of digital audio systems, e.g. as a way to deliver audio from microphones to the signal processor in mobile phones. PDM is ideally suited for this task because it brings the benefits of digital signal processing, such as low noise and freedom from interfering signals, at low cost.

A 1-bit audio driver circuit is basically the combination of a 1-bit DAC followed by an analog filtering amplifier. It may be used as an analog front-end for driving the load of the audio system, for instance a headphone or speakers, within a digital audio system using PDM.

Basically, however, the DAC exhibits a natural offset, which takes the form of a DC voltage applied to the load. This offset causes a DC current to flow through the headphone or speakers, which may result in a reduction of their life time. In addition, the DAC offset is responsible for an unpleasant "CLICK" or "POP" being audible to a user upon the on-switching of the audio system.

Absent any offset cancellation, the offset can provide a lot of "CLICKs" or "POPs" to the headset or speaker at the start-up, particularly with a high gain output amplifier. It also reduces the life time of these transducers.

Assuming a digital/analog partitioning including Baseband digital part and analog front-end within the same chip, it is relatively easy to cancel at the digital part the natural offset provided by the analog front-end. Indeed, the offset at the output can be measured once, for instance at the time of industrial test, and saved in a register, e.g. a One Time Programmable (OTP) memory register, in the Base-band digital part in order to remove it by digital signal processing. Such offset cancellation scheme can advantageously have the same granularity (quantization) as the digital data input.

However, with a partitioning including digital Base-band in a part, for example using a PDM architecture, and analog front-end in another part, it may be more difficult to remove the natural offset of the DAC. Cancelling the offset by subtracting a fixed value from the audio data at digital level is not really an option, due to the response delay within the digital chain. The difficulty for offset cancellation at analog level stems from the poor resolution of the DAC used in such audio systems relying on the over-sampled, noise-shaped principle tied to the 1-bit audio signal-processing technology.

Even if it was a 5 bits partitioning, with a half Full-scale (½ FS) providing 1 Vrms, the maximum granularity for residual offset after cancellation would be +/−FS/16, namely +/−88 mV. Now, with any headset or speaker sensibility, the "POP" provided by 88 mV step relatively to 1 Vrms is very high. Indeed, with 1 Vrms analog audio signal from the DAC, followed by a 14 dB gain amplifier in order to provide 5 Vrms at the output, a 8 ohms loudspeaker with 91.5 dB SPL/W at 1 meter provide 95.5 dB SPL. With the same set-up, a +/−88 mV×5 (i.e., 14 dB) step at power-up provide 74 dB SPL on 1 msec, which generates an audible "POP".

SUMMARY

A first aspect of the present invention relates to an audio driver circuit, comprising:
a main, 1-bit digital-to-analog converter, DAC, adapted to receive a 1-bit oversampled digital audio signal, and to output an analog converted version of said digital audio signal;
an offset cancellation block having:
a logic block configured to modulate in frequency modulo 2P a given P-bit digital offset compensation value, where P is an integer equal to or higher than unity, for outputting modulated digital offset compensation signal; and,
an auxiliary DAC configured to output an analog converted version of the modulated digital offset compensation signal; and,
an analog mixer adapted to combine the analog audio signal from the main DAC with the analog converted version of the modulated digital offset signal, into an offset compensated analog audio signal.

The driver circuit may additionally comprise an analog filter adapted to smooth the offset compensated analog audio signal and to provide an analog output signal of the driver circuit suitable for driving an audio transducer.

Thanks to this architecture, it is possible to reduce the offset cancellation granularity in order to reach a residual step lower than +/−0.5 mV at power-up, which is low relatively to 1 Vrms at ½ FS. Now, a +/−0.5 mV voltage followed by 14 dB gain corresponds to +/−2.5 mV, that is to say 31 dB SPL on 1 msec: thus, no "POP" can be eared by the user, given the temporal masking effect.

In one embodiment of the present invention, the P-bits offset compensation value is defined based on a measure of a DC voltage at the analog filter output under determined conditions of operation of the driver circuit.

In some embodiments, the main DAC and the auxiliary DAC both have a thermometer code based DAC architecture with respective complementary current outputs, followed by a summing and current-to-voltage converting stage operating as the analog mixer of the driver circuit.

In addition, the analog filter may be integral with the summing and current-to-voltage converting stage.

In other embodiments the logic block of the offset cancellation block is adapted to modulate the digital offset value as a function of a clock signal clocking both the main DAC and the auxiliary DAC.

For instance, the modulated digital offset signal may be the result of a temporal convolution between the clock signal and the digital offset value, providing a modulated digital offset signal average between $-2^P$ and $+2^P$.

In other embodiments, the conversion coefficient of the auxiliary DAC is lower than the conversion coefficient of the main DAC.

For instance the conversion coefficient of the auxiliary digital-to-analog converter may be at least three times lower than the conversion coefficient of the main digital-to-analog converter.

It may be provided that an out of band power of the analog converted version of the modulated digital offset value associated to an offset introduced in the auxiliary DAC, is lower than an out of band noise provided by the main DAC.

In one embodiment, P=5.

A second aspect relates to a power amplifier of class D type comprising a driver circuit according to the first aspect as presented above.

A third aspect relates to an Integrated Circuit realized in a deep submicron CMOS technology comprising a digital part and an analog part, wherein the analog part comprises the power amplifier of the second aspect.

A fourth aspect relates to a wireless product, comprising the Integrated Circuit according to the third aspect.

Finally, a fifth aspect relates to a method of digital-to-analog converting a 1-bit oversampled digital audio signal, comprising:
generating an analog converted version of the 1-bit oversampled digital audio signal using a main, 1-bit digital-to-analog converter;
modulating in frequency modulo $2^P$ a given P-bit digital offset compensation value, where P is an integer equal to or higher than unity, for generating a modulated digital offset compensation signal;
generating an analog converted version of the modulated digital offset compensation signal using an auxiliary DAC; and,
combining the analog audio signal from the main DAC with the analog converted version of the modulated digital offset signal, into an offset compensated analog audio signal.

BRIEF DESCRIPTION OF THE DRAWINGS

Embodiments of the present invention are illustrated by way of example, and not by way of limitation, in the figures of the accompanying drawings, in which like reference numerals refer to similar elements and in which:

FIG. 1 is a schematic view of a digital audio system without partitioning.

FIG. 2 is a schematic block diagram of a digital audio system with partitioning between a digital and an analog part, which does not implement the proposed solution.

DESCRIPTION OF PREFERRED EMBODIMENTS

Figure 3:
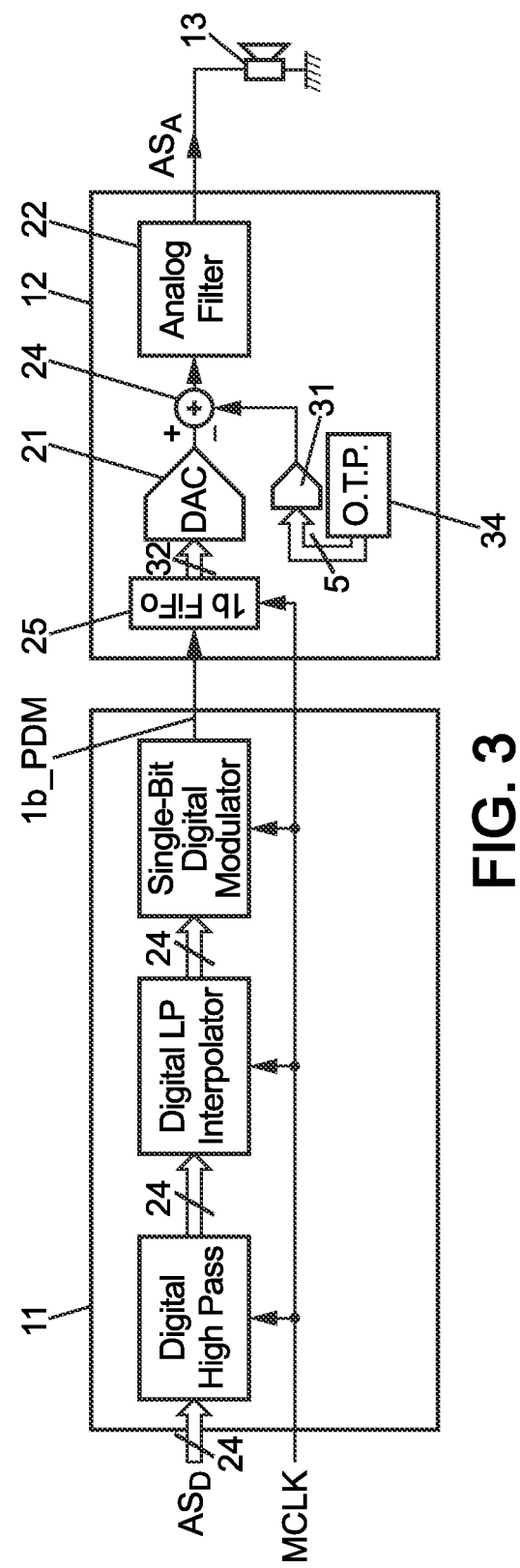
FIG. 3 is a schematic block diagram of a digital audio system with partitioning between a digital and an analog part, which does implement the proposed solution.

One-bit audio signal representation is a way of conveying audio digitally, in mono or stereo, over a clock/data pair. This scheme is also called Pulse Density Modulation (PDM) because the original analog waveform is converted to the density of pulses. The resulting pulses are digital, and are therefore resistant to distortion and noise which may result from signal-processing techniques applied to it.

Unlike the multi-bit Pulse-Code Modulation (PCM) signals used in, e.g. the DVD audio technology, digital-to-analog conversion can be as simple as running the sequence of pulses through an analog low-pass filter. Overall, the complexity and cost of circuitry relying on the 1-bit audio signal-processing technology can be very low.

Embodiments will be described in what follows, in relation to a class-D audio driver circuit. A class-D audio driver circuit is basically the combination of a 1-bit DAC followed by an analog input class-D amplifier. Class-D amplifiers are widely used in battery powered systems, such as mobile phones, to achieve high efficiency. They are particularly suited for driving speakers. Nevertheless, it will be appreciated that other embodiments may relate to a class AB audio driver circuit, namely a combination of the proposed 1-bit DAC followed by an analog input class-AB amplifier. Such other embodiments, indeed, appear to be better suited for the driving of a headset.

In an oversampled noise-shaped device such as a 1-bit DAC, a sampled input audio signal is represented as a stream of single bits which has been obtained by increasing the sampling rate of the input audio signal by a large factor (called the oversampling ratio) and reducing the word length, i.e. the number of bits used to represent a sample, to 1 bit. The 1-bit signal contains the audio in the low part of the frequency spectrum.

In digital systems, a signal is said to be at digital Full-scale (FS) when it has reached the maximum (or minimum) value which can be represented, namely digitally encoded with the number of bits. In an unsigned fixed point binary representation, this occurs when all bits are logical 1s. For the purpose of the present description, we will assume a signed fixed point binary representation. Thus, half Full-scale (½ FS) is reached when the most significant bit (MSB) is 0 and the remaining bits, namely the least significant bits (MSB) are 1s, or conversely when the MSB is 1 and the LSBs are 0s.

The measured dynamic range of a digital system is the ratio of the Full-scale signal level to the Round Means Square (RMS) noise floor. The theoretical minimum noise floor is caused by quantization noise. This is usually modeled as a uniform random fluctuation between −½ LSB and +½ LSB.

Referring to FIG. 1, there is schematically shown therein a digital audio system 10 without partitioning between a Base-Band (BB) digital section 11 and an analog front-end 12. In other words, parts 11 and 12 are within the same semiconductor chip.

The digital audio system 10, namely the BB digital section 11 thereof, is configured to receive in input a master clock signal MCLK and a digital audio signal $AS_D$. In the shown embodiments, this digital input may be a 24-bit representation of an audio signal whose incoming sample rate is e.g. 48 kHz.

Depending on the specific implementation, the Base-Band digital section 11 may comprise an audio processor (for instance running around 200 MHz), a memory (such as SDRAM or the like), etc., configured to process the digital audio signal $AS_D$. These elements are not shown in the drawings and will not be further described in what follows, since the proposed offset cancellation scheme does not interfere with the digital audio signal processing as such.

The Sigma-Delta modulator operates by interpolating the digital input signal whose typical incoming sample rate is, e.g., 48 kHz. Typically, the oversampling ratio is 64, that is, 63 new samples are generated for each input sample. So, to achieve a bandwidth of 24 kHz (which corresponds to Fs/2 with Fs=48 kHz), a master clock frequency of 3.072 MHz may be used. For the sake of simplification, we will refer to a 3 MHz frequency in what follows.

The Sigma-Delta modulator may be, e.g. a fourth order Sigma Delta modulator (SDM4). While other types of Sigma-Delta modulators may also be suitable depending on the application, a fourth order modulator offers a good compromise between noise performance and complexity.

The oversampling frequency may be comprised in the range from 2.4 MHz to 6.4 MHz. In one embodiment, it is set to 3.2 MHz.

The analog front-end 12 is adapted to generate in output an analog audio signal $AS_A$ suitable for driving a load 13 such as a headset or speakers. It can comprise a 1-bit audio driver circuit having a 1-bit DAC 121 with a 1-bit to $2^P$-bit converter such as a shift register followed by an analog filtering amplifier 22 which outputs the analog output signal $AS_A$ to the load 13. In the shown example For the most part, the analog section 11 and the digital section 12 are completely separate. In the shown example, the DAC 21 straddles the partition which is symbolised by dashed line 23. In addition to the one-bit oversampled digital audio signal 1b_PDM, some digital signals (not shown) may pass over the boundary 23, for instance pseudo-static control lines. The master clock signal MCLK also crosses the boundary 23 from the digital part 11 to the analog part 12.

Turning now to FIG. 2, there is shown therein a schematic view of a digital audio system 20 with a one-bit partitioning between a Base-Band digital part 21 and an analog front-end part 22. It means that these two parts may be realized within respective semiconductor chipsets, or IP blocks of a System-on-Chip (SoC).

The analog part of the system can comprise the audio driver 12 as shown in FIG. 1, in which the amplifier is e.g. a Class D amplifier or a Class AB amplifier, which are suitable amplifiers for driving an audio transducer such as e.g. speakers and a headset, respectively.

FIG. 2 further illustrates a possible offset cancellation technique which does not appear to be satisfactory in practise. Indeed, in order to cancel at the digital part the natural offset provided by the analog front-end, one may consider measuring the offset at the output, for instance once at the time of industrial test. Based on the measured value an appropriate offset correction value could be saved in a OTP memory register 14, in the analog part 12, in order to remove it digitally, upstream of the DAC. Such offset cancellation technique is however not really feasible in practise, due to the poor granularity (quantization) of the 1-bit digital audio signal 1b_PDM received by the analog part 12 from the digital part.

The general concept of the proposed solution will now be presented with reference to the schematic block diagram of FIG. 3.

The basic principle on which embodiments rely, is to reduce the offset granularity in order to reach a step lower than +/−0.5 mV residual one relatively to 1 Vrms at ½ FS.

Now, +/−0.5 mV followed by 14 dB gain corresponds to +/−2.5 mV and, with previous set-up, to 31 dB SPL on 1 msec. Under these conditions, the user will not hear "POP", thanks to the temporal masking effect.

In order to reach the +/−0.5 mV residual offset: granularity must be 1 mV. This granularity must be 2×1.414/1e-3 times lower than the Full Scale reference, that is to say 88.4 time lower than the quantum of a 5 bits equivalent converter.

The proposed audio driver circuit, comprises the 1-bit DAC 21 as a main DAC, which receives the 1-bit oversampled digital audio signal 1b_PDM, and outputs an analog converted version of it. This main DAC cooperates with a 1-bit shift register, for example a FIFO (First-in-First-out) architecture, which converts a number N bits of successive bits of the 1b_PDM signal as received in sequence into a N-bit binary word passed to the input of the DAC, where N is an integer equal to or higher than unity.

Figure 4:
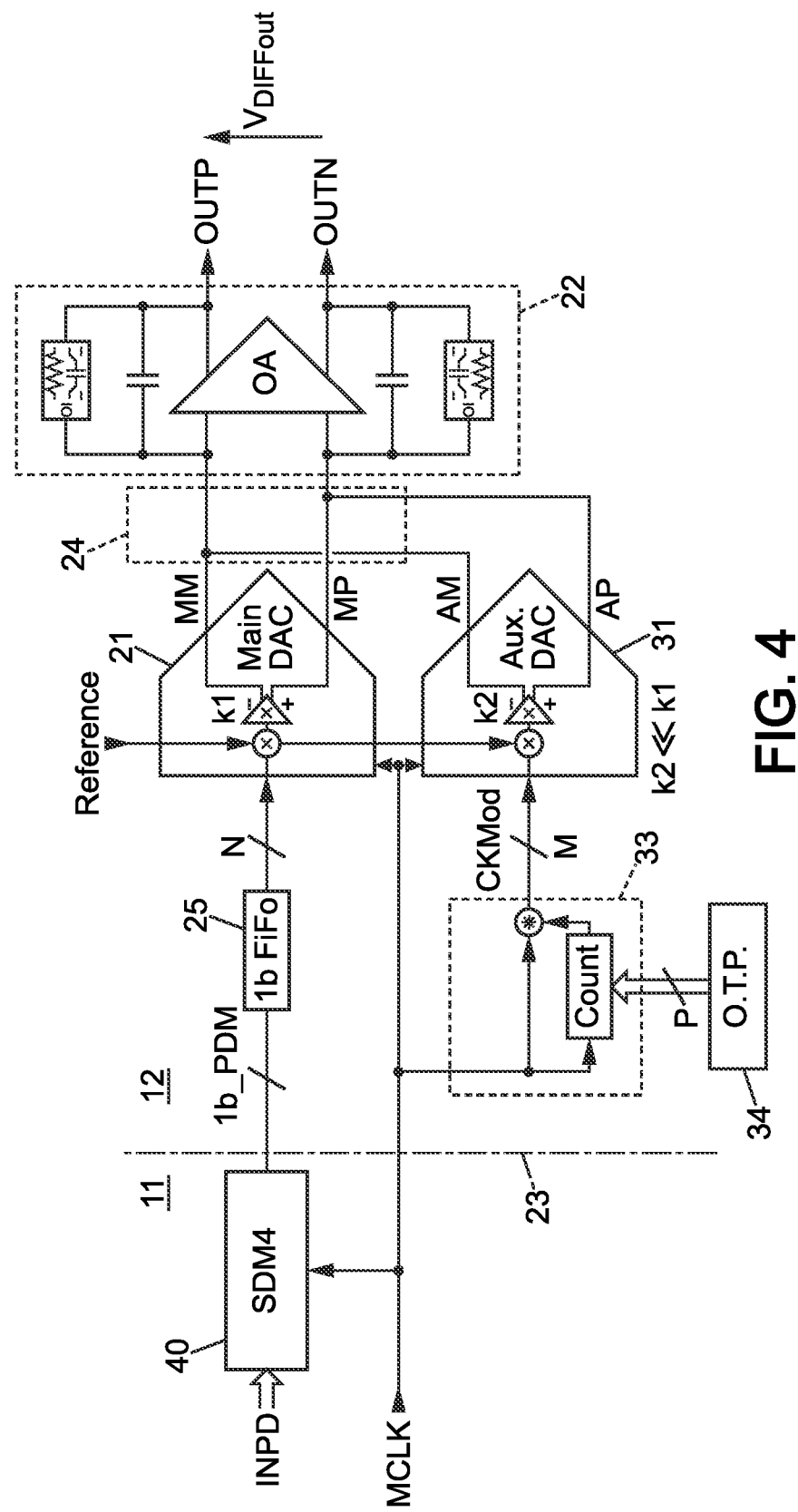
FIG. 4 is a schematic block diagram of an embodiment of the main DAC and auxiliary DAC as proposed herein.

The driver circuit further comprises an offset cancellation block comprising means 33, 34, 31, and 24 as follows, in view further of the example of implementation as shown in FIG. 4.

A logic block 33 is configured to modulate in frequency modulo $2^P$ a given P-bit digital offset compensation value, where P is an integer equal to or higher than unity, for outputting modulated digital offset compensation signal CKMod.

The P-bit digital offset compensation value may be stored in e.g. a OTP register 34. The P-bit digital offset compensation value may be defined, for instance once in the life of the circuit, based on a measure of a Direct Current (DC) voltage at output of the analog filter 22 under determined conditions of operation of the driver circuit, for example when received the digital audio signal is a pure sinus wave of given frequency within the audio band of [20 Hz-20 kHz].

In the shown example, N=48 and P=5. Relation between M, N, P is linked to how much the offset must be compensated. The relevant criteria is imposed by minimum audibility of the "CLICK" which may be tolerated in the audio system, which is correlated to the offset itself.

The driver circuit further comprises an auxiliary DAC 31, which is configured to output an analog converted version of the modulated digital offset compensation signal. In the example as shown in FIG. 4, this analog converted version of the modulated digital offset compensation signal is defined by differential currents AM and AP, as will be further described below. Also, the analog audio signal available at the output of the main DAC 21 is defined by differential currents MM and MP, as will also be further described below.

Still further, the driver circuit further comprises an analog mixer 24 which is adapted to combine the analog audio signal MM-MP from the main DAC 21 with the analog converted version AM-AP of the modulated digital offset signal CKmod, into an offset compensated analog audio signal, which is provided to the input of the analog filter 22.

Finally, the driver circuit comprises the analog filter 22 which is adapted to smooth the offset compensated analog audio signal and to provide the analog output signal $AS_A$ of the driver circuit suitable for driving the audio transducer 13.

With reference to FIG. 4, the Sigma-Delta modulator 40, which belongs to the digital part 11, processes input audio data INPD while operating from the master clock signal MCLK frequency of e.g. 3.2 MHz. The oversampling ratio of the modulator is fixed in relation to the modulator frequency. In one embodiment, the oversampling ratio of the modulator is 64, and with the modulator frequency running at 3.2 MHz, the data rate is 48 kHz.

With this modulation in a well know frequency (minimum=3 MHz/32), the added energy stay out of the audio-band, lost into the noise shaped from digital modulator.

The basic principle on which embodiments rely, consists in reducing the offset compensation granularity in order to reach a step lower than +/−0.5 mV residual one relatively to 1 Vrms at ½ FS.

Now, +/−0.5 mV followed by 14 dB gain corresponds to +/−2.5 mV and, with previous set-up, to 31 dB SPL on 1 msec. Under these conditions, the user will not hear "POP", thanks to the temporal masking effect.

In order to reach the +/−0.5 mV residual offset, the offset compensation granularity must be 1 mV at maximum.

This granularity must be 2×1.414/1e-3 times lower than the Full Scale reference, that is to say 88.4 times lower than the quantum of a 5 bits equivalent digital-to-analog converter.

As shown in FIG. 4, the main DAC 21 and the auxiliary DAC 31 may both have a so-called "thermometer code based" DAC architecture, for instance with respective complementary current outputs MM-MP and AM-AP, respectively. Such architecture will be described in further details below, with respect to the example shown in FIG. 7.

The two DACs 21 and 31 may be followed by a summing and current-to-voltage converting stage, whose input operates as the analog mixer 24 of the driver circuit. More precisely, because the analog audio signal MM-MP and the analog converted version AM-AP of the modulated digital offset signal CKmod are current signals, they may be added by simply connecting wires as shown in FIG. 4.

In the shown example, the summing and current-to-voltage converting stage is an operational amplifier (OA) based, differential input—differential output current-to-voltage converter, which delivers a differential output voltage $V_{DIFFout}$ which is suitable for driving the audio transducer 13.

In some embodiments the analog filter 22 of FIG. 3 is integral with the summing and current-to-voltage converting stage. This may be achieved by inserting RC cells in the feedback paths of the OA, as shown in FIG. 4.

To summarize, both the analog mixer 24 and the analog filter 22 may be embodied by the OA based current-to-voltage converter arranged as shown in FIG. 4.

In some embodiments, the main DAC 21 has a number k1 of elementary cells, and the auxiliary DAC 31 has a number k2 of elementary cells, where k2 is substantially lower than k1, for instance at least 10 times lower. As shown in the example presented in FIG. 7 which will be described in more details below, the elementary cells of the auxiliary converter 31 may have a current capability e.g. 3 times lower than the main DAC elementary cells current capability. This may be achieved by using, for the main DAC 21, NMOS transistors with channel width of 3×Wn_min and PMOS transistors with channel width of 6×Wp_min, where Wn_min and Wp_min are the channel widths of a NMOS and of a PMOS of the auxiliary DAC 31, respectively. The choice of k1 and k2 is linked to how much down the offset has to be canceled (i.e. +/−307 uV in the example considered here, and which will be further detailed below with respect to FIG. 7). For instance, K2 may be chosen so as, in addition, to be a sub-multiple of k1. Thus, the Auxiliary DAC is simply designed with sub-multiple elements of the Main DAC. In some embodiments, the auxiliary DAC is made with same reference as the main DAC, with matched elementary elements.

The quantum of both the main DAC 21 and the auxiliary DAC 31 may be chosen in view of the above considerations as well. For instance, the main DAC 21 has a quantum which is linked to the audio resolution which is desired for the audio system, and the auxiliary DAC 31 has a quantum which is determined based on the limit to be achieved for the offset cancellation.

Thermal noise added by the auxiliary DAC 31 is insignificant because gain on this added element is very low. Also, the added quantization noise resulting from the auxiliary DAC will be removed, as well as the residual shaped noise, by the analog filter 22 and the speaker solenoid.

Figure 5:
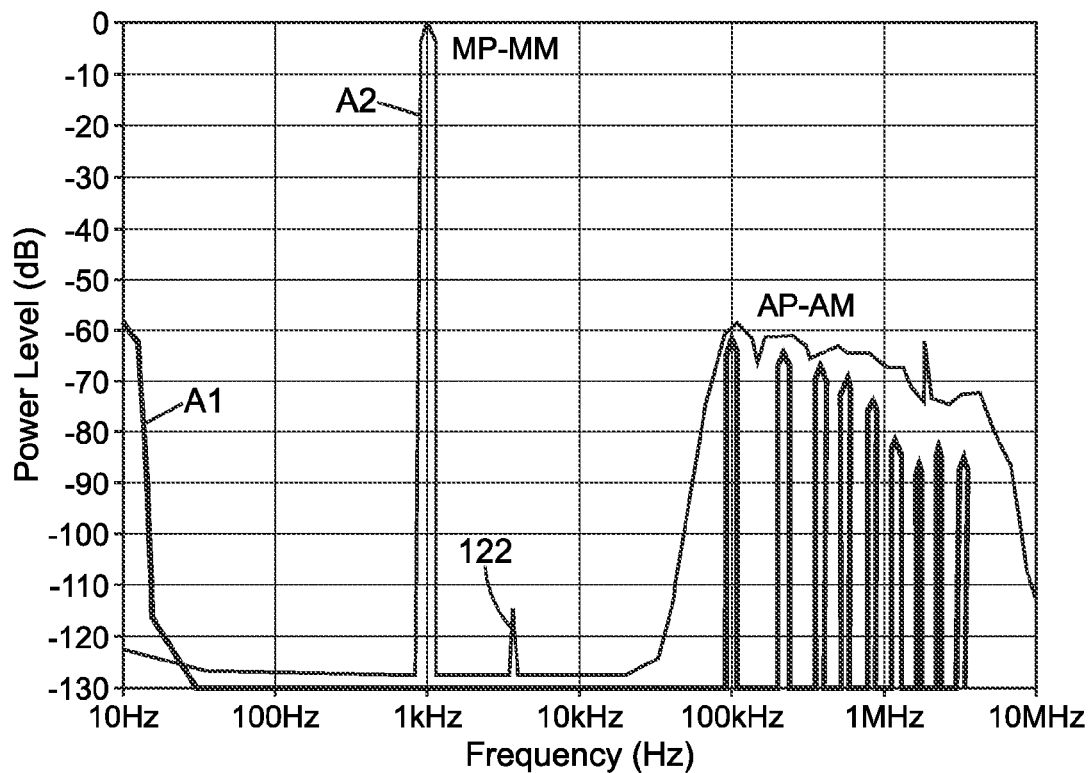
FIG. 5 is a spectrum diagram which shows the frequency response of the main DAC and auxiliary DAC.

FIG. 5 is a spectrum diagram showing the frequency response (i.e. the spreading of power in dB as a function of frequency in Hz) of the main DAC 31 (graph A1) and of the auxiliary DAC (graph A2), when the PDM modulator is fed with a sine wave input signal. More precisely, graph A1 shows the frequency spectrum of the differential signal MP-MM at the output of the main DAC 21, and graph A2 shows the frequency spectrum of the differential signal AP-AM at the output of the auxiliary DAC 31.

As shown by graph A1 in FIG. 5, there is a 1 kHz test zone for the digital input signal. The passband extends from 0 to ½ FS on the X-axis, with FS=48 kHz and thus 0.5×FS=24 kHz. Above that is the spectral noise created by the oversampling, which is removed by the analog output filter-amplifier 22. In other words, the effects of noise shaping which shifts the noise above the passband [20 Hz-20 kHz] are to be seen on both curve A1 and curve A2. The sharp rise of noise above the passband is clearly visible. Also visible is a small amount of third harmonic distortion, namely a peak 122 at approximately 0.06×FS.

It will be appreciated from FIG. 5 that the offset value is mainly defined by curve A2 at DC (i.e. zero frequency value), i.e. by the contribution of the auxiliary DAC. It follows that, by choosing a suitable offset correction value which is stored in the OTP register 34, it is possible to correct any existing offset from the output signal $V_{DIFFout}$.

This is the illustration of the principle on which the proposed embodiments rely. Indeed, by voluntarily introducing, at the analog output driver, a known offset voltage from the auxiliary DAC, it is possible to compensate for the existing offset introduced by the main DAC. Thus, an offset compensated analog audio signal $AS_A$ can be obtained at the output signal of the driver circuit, which is suitable for driving an audio transducer such as the speakers or earphone 13.

Figure 6:
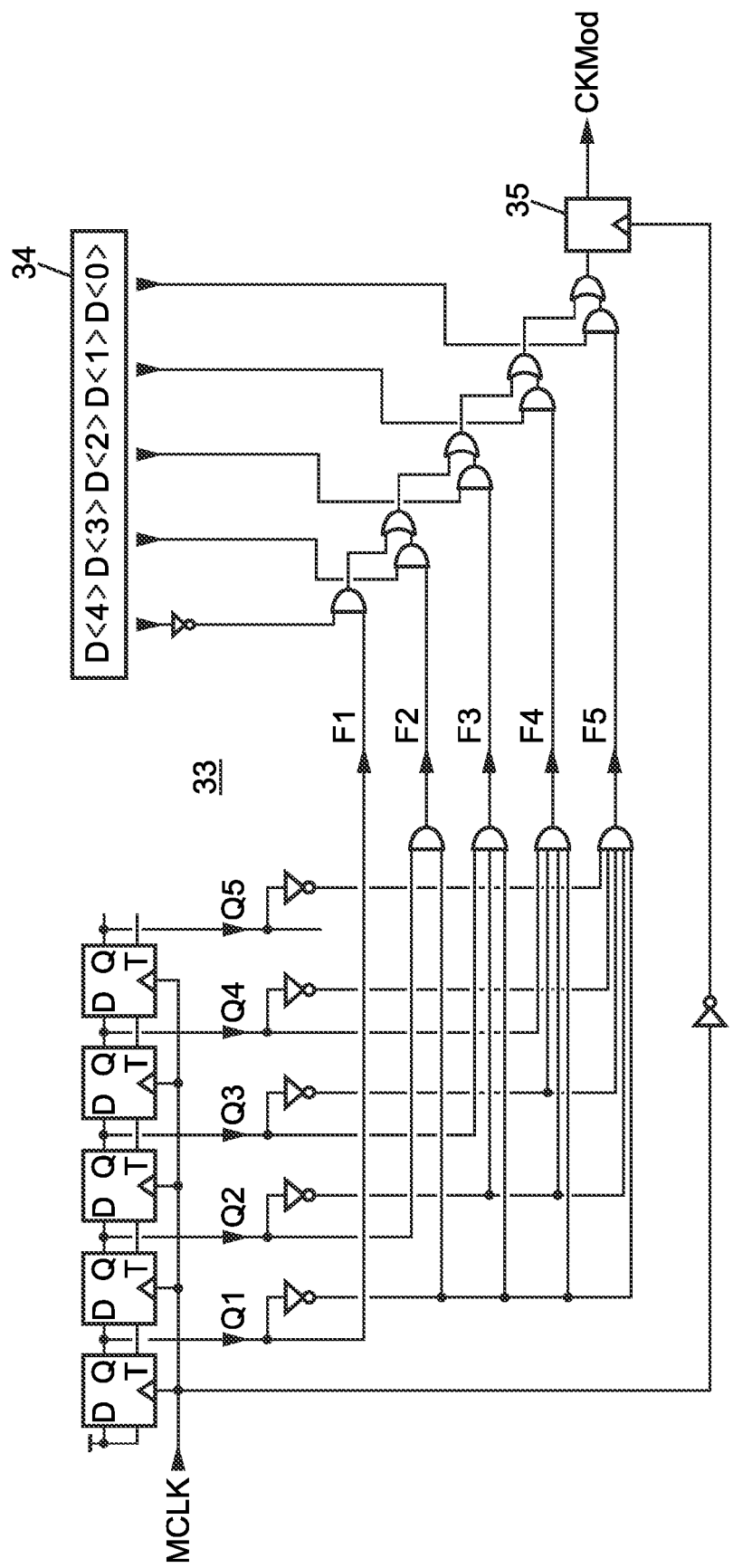
FIG. 6 is a simplified block diagram of an example of logic block suitable for implementing part of the proposed solution.

With reference now to FIG. 6, the logic block 33 (FIG. 4) of the offset cancellation block may be designed so as to modulate the digital offset value as a function of the master clock signal MCLK which clocks both the main DAC 21 and the auxiliary DAC 31.

In some embodiments illustrated by FIG. 6, indeed, the modulated digital offset signal CKMod may be, for example, the result of a temporal convolution between the clock signal and the digital offset value, providing a modulated digital offset signal average between $-2^P$ and $+2^P$.

To that end, the logic block 33 may comprise a number P of cascaded flip-flops, all clocked by the master clock signal MCLK, which output logical signals Q1, Q2, . . . QP, respectively, where P=5 in the shown example.

These signals Q1, Q2, . . . QP are combined in a suitable manner using P inverters and P−1 logic gates of e.g. AND-type, to generate logic signals F1, F2, . . . FP, with P=5 in the shown example.

These signals F1, F2, . . . FP are then combined with the P bits D<0>, D<1>, . . . D<P−1> of the digital offset compensation value as stored in the OTP register 34, thanks to additional logic gates of e.g. the AND-type and OR-Type and to an output flip-flop 35 arranged as shown in FIG. 6.

The modulated digital offset signal CKMod is provided at the output of flip-flop 35 which is clocked by the master clock signal MCLK.

Describing the structure and operation of the logic block 33 in more details would be beyond the scope of the present description, and the one with ordinary skills in the art may refer to the relevant technical literature of logical circuit design for more information in that respect.

Figure 8:
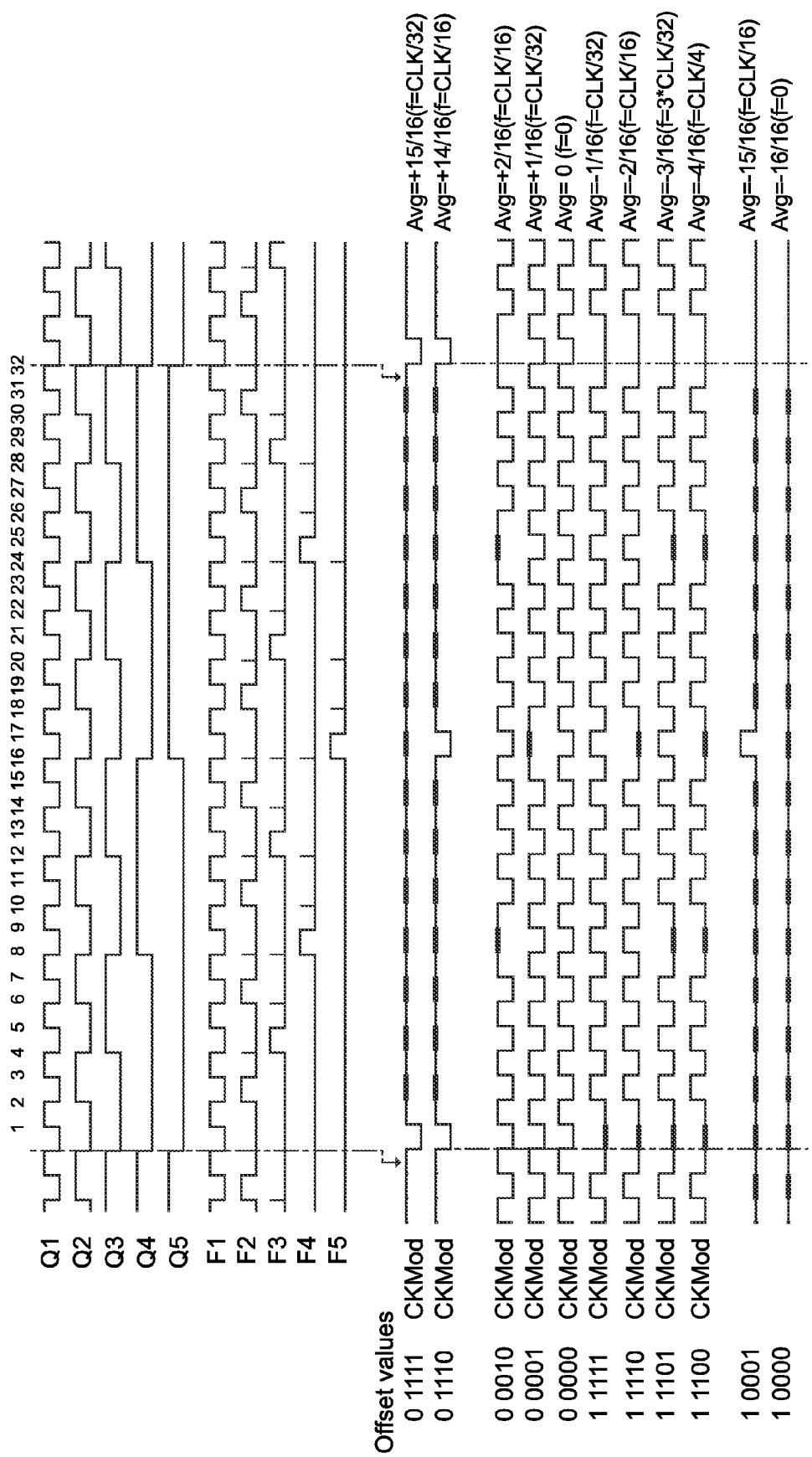
FIG. 8 are chronograms of signals generated by the counter of FIG. 6, and of generated clock signals obtained for different offset compensation values which may be considered.

FIG. 8 are chronograms of signals generated by the logic block of FIG. 6, and of signals CLMod obtained for different digital offset compensation values which may be considered.

Figure 7:
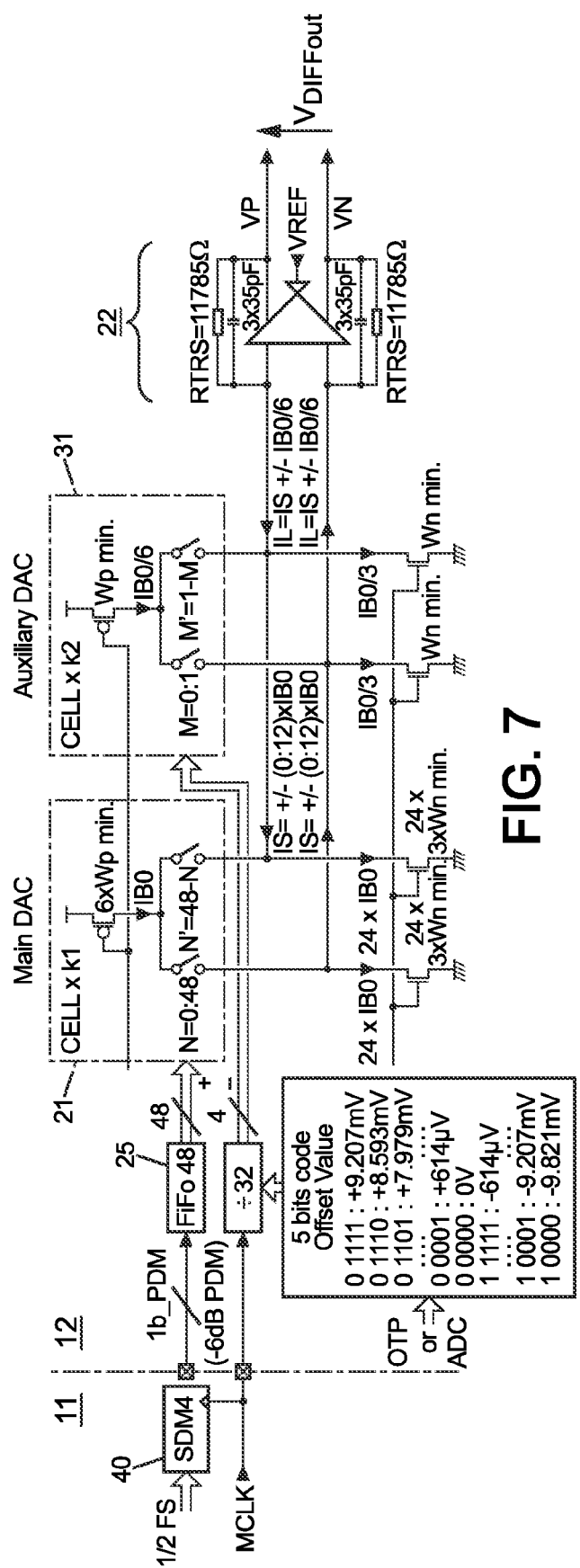
FIG. 7 is a schematic diagram of a possible practical implementation of the audio driver circuit as proposed herein.

Referring now to FIG. 7, there is shown therein a schematic view of an example of implementation of the audio driver circuit, of which the elements which have already been described will not be described again The main purpose of FIG. 7 is to illustrate a possible implementation of the main and auxiliary DACs in more details.

In the shown example, the main DAC 21 and the auxiliary DAC 31 are both implemented as a thermometer code based DAC (also referred to as thermometer DAC, in short).

A thermometer DAC has many advantages such as guaranteed monotonicity, reduced glitching noise, and linearity. It contains an equal current-source cell for each possible value of DAC output, corresponding to a given quantum. Thus, the k1-bit thermometer DAC implementing the main DAC 21 has $2^{k1}$ elementary cells, and the k2-bit thermometer DAC implementing the main DAC 31 has $2^{k2}$ cells. In the example shown in FIG. 7, we have k1=48 and k2=4. It will be appreciated that this example is purely illustrative and is not intended the limit the scope of the present description.

In each thermometer DAC, the k1 or k2 cells may be implemented as ½ k1 and ½ k2 complementary output switches, respectively. In each respective DAC, each of the ½ k1 and ½ k2 current branch, respectively, carries equal amounts of currents IB0. The currents IB0 through these switches are conditionally directed either into the operational amplifier based summing circuit 24, or directly to the ground, based on bit values of the N-bit binary words at the output of the FIFO 25 for the main DAC 21, or based on the M-bit binary words of the modulated offset compensation signal CKMod for the auxiliary DAC 31, respectively. In some embodiments, the conversion coefficient k2 of the auxiliary DAC 31 is lower than the conversion coefficient k1 of the main DAC 21. In one example, k2 is at least three times lower than the k1. More generally k2 is Q times lower than the k1, where Q is an integer at least equal to 3 (Q>=3).

With auxiliary DAC with elementary current sources of Q time lower current capability than the main DAC, the proposed solution is to modulate, in frequency, modulo $2^P$ (i.e. 32 with P=5), a Q time lower the elementary element of a k1 levels main DAC. That is to say, the converter k2 is chosen such that k2<<k1 (k2 is significantly, namely Q times lower than k1 with Q>1, for example Q>10), with, in one example:

N=48;
M=4;
P=5;
k1=48 (giving a 5.5 bits equivalent DAC); and,
Q=12.

Thus, the quantum of the auxiliary DAC 31 will be:

(2×1.414V)/(48×3×32)=613.71 µV.

With 4 elements of ⅓ elementary current capability relative to the main converter 21, the required number of bits for the auxiliary converter 31 may be found to be:

4×32×quantum=4 bits, from −9.821 mV to 9.207 mV.

Thus, k2 may be chosen to be equal to 4 (k2=4).

The achieved result is that the out-of-band power of the analog converted version of the modulated digital offset value associated to the offset introduced in the auxiliary DAC, is lower than the out-of-band noise provided by the main DAC. Thus, this additional out-of-band noise will be filtered by the analog output filter 22 as well.

Figure 9:
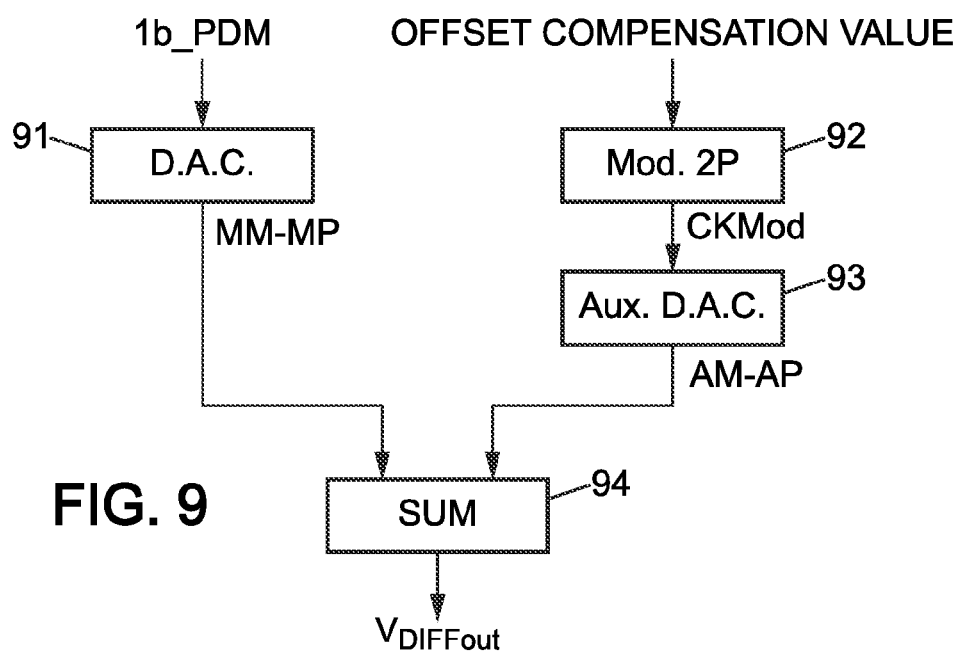
FIG. 9 is a flow chart showing steps of a method according to the fifth aspect.

With reference to the flow chart of FIG. 9, a method of digital-to-analog converting a 1-bit oversampled digital audio signal implementing the proposed solution may comprise the following steps:

in 91, generating the analog converted version MM-MP of the 1-bit oversampled digital audio signal using the main, 1-bit digital-to-analog converter 21;

in 92, modulating in frequency modulo $2^P$ the P-bit digital offset compensation value stored in register 14, where P is an integer equal to or higher than unity, for generating the modulated digital offset compensation signal CKMod;

in 93, generating the analog converted version AM-PM of the modulated digital offset compensation signal using the auxiliary DAC 31; and, in 94, combining the analog audio signal from the main DAC with the analog converted version of the modulated digital offset signal, into an offset compensated analog audio signal $V_{DIFFout}$, which, when smoothed by the analog filter 22, is an analog output signal ($AS_A$) suitable for driving an audio transducer 13.

To summarize, advantages of the embodiments described above comprise at least some of the following:

Capability to add DC offset with high resolution on poor resolution over-sampled (main) DAC;

High accuracy of the added offset compensating the existing offset introduced by the main DAC;

"POP" free audio restitution;

No direct current (DC) on the audio transducer (headset or speakers), which could reduce their life time, and which consumes power from the battery of the wireless product; and, finally, Limitation of the Electromagnetic Interferences (EMI) caused by the operation of the driver circuit.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

A person skilled in the art will readily appreciate that various parameters disclosed in the description may be modified and that various embodiments disclosed and/or claimed may be combined without departing from the scope of the invention.

It is stipulated that the reference signs in the claims do not limit the scope of the claims, but are merely inserted to enhance the legibility of the claims.

The invention claimed is:

1. Audio driver circuit, comprising:
    a main, 1-bit digital-to-analog converter, DAC, configured to receive a 1-bit oversampled digital audio signal, and to output an analog converted version of said digital audio signal;
    an offset cancellation block having:
        a logic block configured to modulate in frequency modulo $2^P$ a given P-bit digital offset compensation value, where P is an integer equal to or higher than unity, for outputting a modulated digital offset compensation signal; and,
        an auxiliary DAC configured to output an analog converted version of the modulated digital offset compensation signal; and,
    an analog mixer configured to combine the analog audio signal from the main DAC with the analog converted version of the modulated digital offset signal, into an offset compensated analog audio signal.

2. The driver circuit of claim 1, further comprising an analog filter configured to smooth the offset compensated analog audio signal and to provide an analog output signal suitable for driving an audio transducer.

3. The driver circuit of claim 1, wherein the P-bits offset compensation value is defined based on a measure of a DC voltage at the analog filter output under determined conditions of operation of the driver circuit.

4. The driver circuit of claim 1, wherein the main DAC and the auxiliary DAC both have a thermometer code based DAC architecture with respective complementary current outputs, followed by a summing and current-to-voltage converting stage.

5. The driver circuit of claim 4, wherein the analog filter is integral with the summing and current-to-voltage converting stage.

6. The driver circuit of claim 1, wherein the logic block of the offset cancellation block is adapted to modulate the digital offset value as a function of a clock signal clocking both the main DAC and the auxiliary DAC.

7. The driver circuit of claim 6, wherein the modulated digital offset signal is the result of a temporal convolution between the clock signal and the digital offset value, providing a modulated digital offset signal average between $-2^P$ and $+2^P$.

8. The driver circuit of claim 1, wherein the conversion coefficient of the auxiliary DAC is lower than the conversion coefficient of the main DAC.

9. The driver circuit of claim 8, wherein the conversion coefficient of the auxiliary digital-to-analog converter is at least three times lower than the conversion coefficient of the main digital-to-analog converter.

10. The driver circuit of claim 1, wherein an out of band power of the analog converted version of the modulated digital offset value associated to an offset introduced in the auxiliary DAC, is lower than an out-of-band noise provided by the main DAC.

11. The driver circuit of claim 1, wherein P=5.

12. Audio power amplifier comprising an audio driver circuit according to claim 1.

13. Integrated Circuit comprising a digital part and an analog part), wherein the analog part comprises the audio power amplifier of claim 12.

14. Wireless product, comprising the Integrated Circuit of claim 13.

15. Method of digital-to-analog converting a 1-bit oversampled digital audio signal, comprising:
    generating an analog converted version of the 1-bit oversampled digital audio signal using a main, 1-bit digital-to-analog converter;
    modulating in frequency modulo $2^P$ a given P-bit digital offset compensation value, where P is an integer equal to or higher than unity, for generating a modulated digital offset compensation signal;
    generating an analog converted version of the modulated digital offset compensation signal using an auxiliary DAC;
    combining the analog audio signal from the main DAC with the analog converted version of the modulated digital offset signal, into an offset compensated analog audio signal.

* * * * *